(12) United States Patent
Kim

(10) Patent No.: US 8,159,891 B2  
(45) Date of Patent: Apr. 17, 2012

(54) SENSING CHARACTERISTIC EVALUATING APPARATUS FOR SEMICONDUCTOR DEVICE AND METHOD THEREOF

(75) Inventor: Taek-Seung Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 374 days.

(21) Appl. No.: 12/488,916

(22) Filed: Jun. 22, 2009

(65) Prior Publication Data

US 2010/0220519 A1 Sep. 2, 2010

(30) Foreign Application Priority Data

Mar. 2, 2009 (KR) .................. 10-2009-0017537

(51) Int. Cl.
G11C 29/00 (2006.01)

(52) U.S. Cl. ........ 365/201; 365/207; 365/210.1; 365/163; 365/189.07

(58) Field of Classification Search .......... 365/201, 365/207, 210.1, 163, 189.07
See application file for complete search history.

(56) References Cited

U.S. PATENT DOCUMENTS

| | | | |
|---|---|---|---|
| 5,025,344 A * | 6/1991 | Maly et al. | 361/88 |
| 5,034,923 A * | 7/1991 | Kuo et al. | 365/189.16 |
| 5,351,214 A * | 9/1994 | Rouy | 365/185.21 |
| 5,355,341 A * | 10/1994 | Gaultier et al. | 365/201 |
| 5,444,656 A * | 8/1995 | Bauer et al. | 365/185.2 |
| 5,491,662 A * | 2/1996 | Pezzini | 365/189.03 |
| 5,661,690 A * | 8/1997 | Roohparvar | 365/201 |
| 5,773,997 A * | 6/1998 | Stiegler | 327/53 |
| 5,784,314 A * | 7/1998 | Sali et al. | 365/185.2 |
| 6,791,890 B2 * | 9/2004 | Ooishi | 365/189.15 |
| 7,483,302 B2 | 1/2009 | Hung et al. | |
| 7,515,493 B2 | 4/2009 | Di Vicenzo et al. | |
| 2005/0030809 A1 * | 2/2005 | Vimercati et al. | 365/222 |
| 2008/0013381 A1 | 1/2008 | Giambartino et al. | |
| 2008/0298133 A1 | 12/2008 | Kim et al. | |
| 2011/0050248 A1 * | 3/2011 | Bray et al. | 324/644 |

FOREIGN PATENT DOCUMENTS

| | | |
|---|---|---|
| JP | 2003-173700 | 6/2003 |
| KR | 1019980058190 | 9/1998 |
| KR | 1020080051847 | 6/2008 |

OTHER PUBLICATIONS

Notice of Preliminary Rejection issued from Korean Intellectual Property Office on Nov. 29, 2010.

* cited by examiner

Primary Examiner — Viet Q Nguyen
(74) Attorney, Agent, or Firm — IP & T Group LLP

(57) ABSTRACT

A sensing characteristic evaluating apparatus for a semiconductor device includes a test current supply unit configured to supply a test current to an input/output line during a test mode for evaluating a sensing characteristic, and a sensing amplifying circuit configured to receive the test current from the input/output line, to compare and amplify a sensing input voltage corresponding to the test current with a reference voltage, and to output an amplified voltage as a sensing output voltage.

47 Claims, 3 Drawing Sheets

US 8,159,891 B2

SENSING CHARACTERISTIC EVALUATING APPARATUS FOR SEMICONDUCTOR DEVICE AND METHOD THEREOF

CROSS-REFERENCE TO RELATED APPLICATIONS

The present application claims priority of Korean patent application number 10-2009-0017537, filed on Mar. 2, 2009, the disclosure of which is incorporated herein by reference in its entirety.

BACKGROUND OF THE INVENTION

The present invention relates to a semiconductor device, and more particularly, to a sensing characteristic evaluating apparatus for a semiconductor device and method thereof, which evaluates a current sensing characteristic for a semiconductor device by sensing a current of a semiconductor memory cell.

A semiconductor device performs a read operation by outputting data stored in a semiconductor memory cell through a local input/output line.

FIG. 1 is a circuit diagram illustrating a conventional memory device for performing a data read operation.

The conventional memory device shown in FIG. 1 includes a current-voltage converting unit 10, a sense amplifier 20, a switching unit 30 and a memory cell 40.

The current-voltage converting unit 10 includes a first PMOS transistor M1, a first NMOS transistor M2 and a second PMOS transistor M3. The first PMOS transistor M1 drives a current of the local input/output line LIO for providing the sensing input voltage SAIN in response to a current control signal ILDB. The first NMOS transistor M2 switches a connection between the local input/output line LIO and the first PMOS transistor M1. The second PMOS transistor M3 is coupled in parallel with the first NMOS transistor M2 through the local input/output line LIO, and switches a pre-charge voltage VPCG to the local input/output line LIO. The current control signal ILDB is applied to a gate of the first PMOS transistor M1, and a clamp control signal CLMP is applied to gates of the first NMOS transistor M2 and the second PMOS transistor M3.

The sense amplifier 20 compares and amplifies a sensing input voltage SAIN of the current-voltage converting unit 10 with a reference voltage VREF, and outputs an amplified sensing input voltage as a sensing output voltage SAOUT.

The switching unit 30 selectively connects a local input/output line LIO of the current-voltage converting unit 10 to the memory cell 40.

The switching unit 30 includes a transfer gate T1 and an inverter IV1, and is turned on/off in response to an input/output line switching signal LIOSW.

The operation of the conventional semiconductor device will be described in details as below.

If a normal mode operation for reading data stored in the memory cell 40 is started, the input/output line switching signal LIOSW is shifted to a logic high level, and the memory cell 40 is coupled to the local input/output line LIO. At the same time, the first NMOS transistor M2 is turned off and the second PMOS transistor M3 is turned on in response to the clamp control signal CLMP having a logic low level. That is, the pre-charge voltage VPCG is applied to the local input/output line LIO in response to the clamp control signal CLMP having a logic low level, and the local input/output line LIO is pre-charged as a node between the first NMOS transistor M2 and the switching unit 30.

If the clamp control signal CLMP is shifted to a logic high level, the second PMOS transistor M3 is turned off and the first NMOS transistor is turned on. When the clamp control signal CLMP has a logic high level, the current control signal ILDB applied to a gate of the first PMOS transistor M1 maintains a logic low level, and a current path is formed from a sensing voltage VSA terminal to the memory cell 40.

A voltage level of the sensing input voltage SAIN inputted to the sense amplifier 20 is determined by a resistance ratio of the first PMOS transistor M1, the first NMOS transistor M2, the local input/output line LIO, the switching unit 30 and the memory cell 40.

A voltage corresponding to the current which flows on the current path from the sensing voltage VSA terminal to the memory cell 40 is applied to the sensing input voltage SAIN as an output voltage of the current-voltage converting unit 10.

If the memory cell 40 is configured to have at least two different resistance values depending on a phase of data, a current quantity which flows on the current path from the sensing voltage VSA terminal to the memory cell 40 depends on the resistance values. In conclusion, a voltage level difference of the sensing input voltage SAIN outputted from the current-voltage converting unit 10 occurs. The sense amplifier 20 compares, detects and amplifies the sensing input voltage SAIN with a reference voltage VREF, and outputs an amplified voltage as the sensing output voltage SAOUT.

A semiconductor device having high integrated circuits includes a plurality of memory cells and a plurality of sense amplifiers. However, since the sense amplifiers have different characteristic based on a location and a fabricating process, evaluating distribution and deviation values according to characteristics of the sense amplifiers is desirable.

SUMMARY OF THE INVENTION

Embodiments of the present invention are directed to providing an apparatus and method for evaluating deviation and distribution of a sensing characteristic for a sense amplifier using a test voltage. Moreover, embodiments of the present invention are directed to providing an apparatus and method for evaluating a sense amplifier under various environments by controlling a voltage level for evaluating the sensing characteristic of a sense amplifier.

In accordance with an aspect of the present invention, there is provided a sensing characteristic evaluating apparatus for a semiconductor device including: a test current supply unit configured to supply a test current to an input/output line during a test mode for evaluating a sensing characteristic; and a sensing amplifying circuit configured to receive the test current from the input/output line, to compare and amplify a sensing input voltage corresponding to the test current with a reference voltage, and to output an amplified voltage as a sensing output voltage.

The test current supply unit may use a current, which is inputted through an input pad, as the test current, or may use a current, which is generated by controlling a voltage level of an external voltage, as the test current.

The test current supply unit may include a switching unit which is switched in response to a test mode signal which is activated corresponding to the test mode.

The sensing amplifying circuit may include a current-voltage converting unit configured to pre-charge the input/output line before the test mode, and to drive the test current of the input/output line for producing the sensing input voltage during the test mode; and a sense amplifier configured to compare and amplify the sensing input voltage with the reference voltage, and to output the amplified voltage as the sensing output voltage.

The current-voltage converting unit may include a pre-charge unit configured to supply a pre-charge voltage to the input/output line before the test mode; and a driving unit configured to drive the test current, which is inputted to the input/output line, for producing the sensing input voltage during the test mode.

The pre-charge unit may include a first switching unit configured to electrically disconnect the input/output line from the driving unit before the test mode, and to electrically connect the input/output line to the driving unit during the test mode; and a second switching unit configured to electrically connect the input/output line to the driving unit and to supply the pre-charge voltage to the input/output line before the test mode, and electrically disconnect the input/output line from the driving unit during the test mode.

The first switching unit and the second switching unit may be operated in response to an identical control signal. And, the first switching unit may be a PMOS transistor and the second switching unit may be an NMOS transistor.

The driving unit may be a PMOS transistor which outputs the current of the input/output line in response to a current control signal.

The input/output line may be a local input/output line coupled to a memory cell.

In accordance with another aspect of the present invention, there is provided a sensing characteristic evaluating apparatus for a semiconductor device including: a memory cell configured to store data; a switching unit configured to electrically connect the memory cell to an input/output line in response to a test mode control signal and an input/output line switching signal during a normal mode for reading the data stored in the memory cell; a test current supply unit configured to supply a test current to the input/output line in response to the test mode control signal during a test mode for evaluating a sensing characteristic; a current-voltage converting unit configured to convert and output a current, which is provided from the switching unit and the test current supply unit via the input/output line, to a sensing input voltage; and a sensing amplifying circuit configured to compare and amplify the sensing input voltage outputted from the current-voltage converting unit with a reference voltage, and to output an amplified voltage as a sensing output voltage.

The switching unit may include a logic gate configured to performs a logical NAND operation on the test mode signal and the input/output line switching signal; and a switch configured to be switched in response to an output of the logic gate.

The switch may be turned off in response to an enable state of the test mode signal.

The test current supply unit may use the current, which is inputted through an input pad, as the test current, or may use a current, which is generated by controlling a voltage level of an external voltage, as the test current.

The test current supply unit may include a switch which is switched in response to a test mode signal activated during a test mode.

The current-voltage converting unit may pre-charge the input/output line before the test mode, and drive the test current of the input/output line for producing the sensing input voltage during the test mode.

The current-voltage converting unit may include a pre-charge unit configured to supply a pre-charge voltage to the input/output line before the test mode; and a driving unit configured to convert the test current, which is inputted through the input/output line for producing the sensing input voltage during the test mode.

The pre-charge unit may include a first switching unit configured to electrically disconnect the input/output line from the driving unit before the test mode, and to electrically connect the input/output line to the driving unit during the test mode; and a second switching unit configured to electrically connect the input/output line to the driving unit and to supply the pre-charge voltage to the input/output line before the test mode, and to electrically disconnect the input/output line from the driving unit during the test mode.

The first switching unit and the second switching unit may be operated in response to an identical control signal. And, the first switching unit may be a PMOS transistor and the second switching unit may be an NMOS transistor.

The driving unit may include a PMOS transistor which outputs the current of the input/output line in response to a current control signal.

In accordance with another aspect of the present invention, there is provided a sensing characteristic evaluating method for a semiconductor device including: supplying a test current to an input/output line during a test mode; driving the test current as a sensing input voltage; and comparing and amplifying the sensing input voltage with a reference voltage and outputting an amplified voltage as a sensing output voltage.

The sensing characteristic evaluating method for the semiconductor device may further include pre-charging the input/output line before the test mode.

The test current may be supplied from an input pad coupled to an external, or may be generated by controlling a voltage level of an external voltage.

In accordance with another aspect of the present invention, there is provided a sensing characteristic evaluating method for a semiconductor, including: providing a normal current corresponding to data from a memory cell to an input/output line during a normal mode; disconnecting the normal current electrically and providing a test current to the input/output line during a test mode; driving the normal current or the test current of the input/output line as a sensing input voltage; and comparing and amplifying the sensing input voltage with a reference voltage, and outputting an amplified voltage as a sensing output voltage.

The sensing characteristic evaluating method for the semiconductor device may further include pre-charging the input/output line before the test mode.

The test current may be supplied from an input pad coupled to an external, or may be generated by controlling a voltage level of an external voltage.

In accordance with another aspect of the present invention, there is provided a sensing characteristic evaluating apparatus for a semiconductor device, including: a test current supply unit configured to supply a test current to an input/output line during a test mode for evaluating a sensing characteristic for N-bit data, N being an integer greater than one; and a sense amplifying circuit configured to include M sense amplifying units, to receive the test current of the input/output line, to compare and amplify a sensing input voltage corresponding to the test current with a reference voltage which is differently set to each of M sense amplifying units, and to output amplified voltages as sensing output voltages, M being an integer smaller than N.

The test current supply unit may use a current, which is inputted through an input pad, as the test current, or may use a current, which is generated by controlling a voltage level of an external voltage, as the test current.

The test current supply unit may include a switching unit which is switched in response to a test mode signal activated during a test mode.

The sensing amplifying circuit may include a current-voltage converting unit configured to pre-charge the input/output line before the test mode, and to drive the test current of the input/output line as the sensing input voltage during the test mode; and a sense amplifier configured to compare and amplify the sensing input voltage with the reference voltage, and to output the amplified voltage as the sensing output voltage.

The current-voltage converting unit may include a pre-charge unit configured to supply a pre-charge voltage to the input/output line before the test mode; and a driving unit configured to drive the test current, which is inputted to the input/output line, for producing the sensing input voltage during the test mode.

The pre-charge unit may include a first switching unit configured to electrically disconnect the input/output line from the driving unit before the test mode, and to electrically connect the input/output line to the driving unit during the test mode; and a second switching unit configured to electrically connect the input/output line to the driving unit and to supply the pre-charge voltage to the input/output line before the test mode, and to electrically disconnect the input/output line from the driving unit during the test mode.

The first switching unit and the second switching unit may be operated in response to an identical control signal. And, the first switching unit may be a PMOS transistor and the second switching unit may be an NMOS transistor.

The driving unit may be a PMOS transistor which outputs the current of the input/output line in response to a current control signal.

The input/output line may include a local input/output line coupled to a memory cell.

In accordance with another aspect of the present invention, there is provided a sensing characteristic evaluating apparatus for a semiconductor device, including a Phase Random Access Memory (PRAM) cell configured to store N-bit data, N being an integer greater than one; a switching unit configured to electrically connect the PRAM cell to an input/output line in response to a test mode control signal and an input/output line switching signal during a normal mode for reading the data stored in the PRAM cell; a test current supply unit configured to supply a test current to the input/output line in response to the test mode control signal during a test mode for evaluating a sensing characteristic; a current-voltage converting unit configured to convert and output a current, which is provided from the switching unit and the test current supply unit via the input/output line, to a sensing input voltage; and a sensing amplifying circuit configured to include M sense amplifying units, to compare and amplify the sensing input voltage outputted from the current-voltage converting unit with reference voltages, and to output amplified voltages as sensing output voltages, wherein the reference voltages are differently set to each of M sense amplifying units.

The switching unit may include a logic gate configured to performs a logical NAND operation on the test mode signal and the input/output line switching signal; and a switch configured to be switched in response to an output of the logic gate.

The switch may be turned off in response to an enable state of the test mode signal.

The test current supply unit may use the current, which is inputted through an input pad, as the test current, or may use a current, which is generated by controlling a voltage level of an external voltage, as the test current.

The test current supply unit may include a switch which is switched in response to a test mode signal activated during a test mode.

The current-voltage converting unit may pre-charge the input/output line before the test mode, and may drive the test current of the input/output line for producing the sensing input voltage during the test mode.

The current-voltage converting unit may include a pre-charge unit configured to supply a pre-charge voltage to the input/output line before the test mode; and a driving unit configured to convert the test current, which is inputted through the input/output line, for producing the sensing input voltage during the test mode.

The pre-charge unit may include a first switching unit configured to electrically disconnect the input/output line from the driving unit before the test mode, and to electrically connect the input/output line to the driving unit during the test mode; and a second switching unit configured to electrically connect the input/output line to the driving unit and to supply the pre-charge voltage to the input/output line before the test mode, and to electrically disconnect the input/output line from the driving unit during the test mode.

The first switching unit and the second switching unit may be operated in response to an identical control signal.

The first switching unit may be a PMOS transistor and the second switching unit may be an NMOS transistor.

The driving unit may include a PMOS transistor which outputs the current of the input/output line in response to a current control signal.

DESCRIPTION OF SPECIFIC EMBODIMENTS

Other objects and advantages of the present invention can be understood by the following description, and become apparent with reference to the embodiments of the present invention.

Apparatus and method for evaluating a current sensing characteristic for semiconductor device in accordance with embodiments of the present invention provides a test current for evaluating the characteristic of a sense amplifier, and evaluating characteristic deviation and distribution of a sense amplifier with a sensing output voltage of a sense amplifier using the test current.

In this disclosure, a memory cell may be configured to store at least N-bit data, e.g., a multi-bit including 2-bit and 4-bit.

Moreover, this application may be applied to a characteristic evaluation of a sense amplifier for a Dynamic Random Access Memory (DRAM) or a Phase Random Access Memory (PRAM).

Hereinafter, a semiconductor device for evaluating a current sensing characteristic of a memory cell in accordance with an embodiment of the present invention will be described as below.

Figure 1:
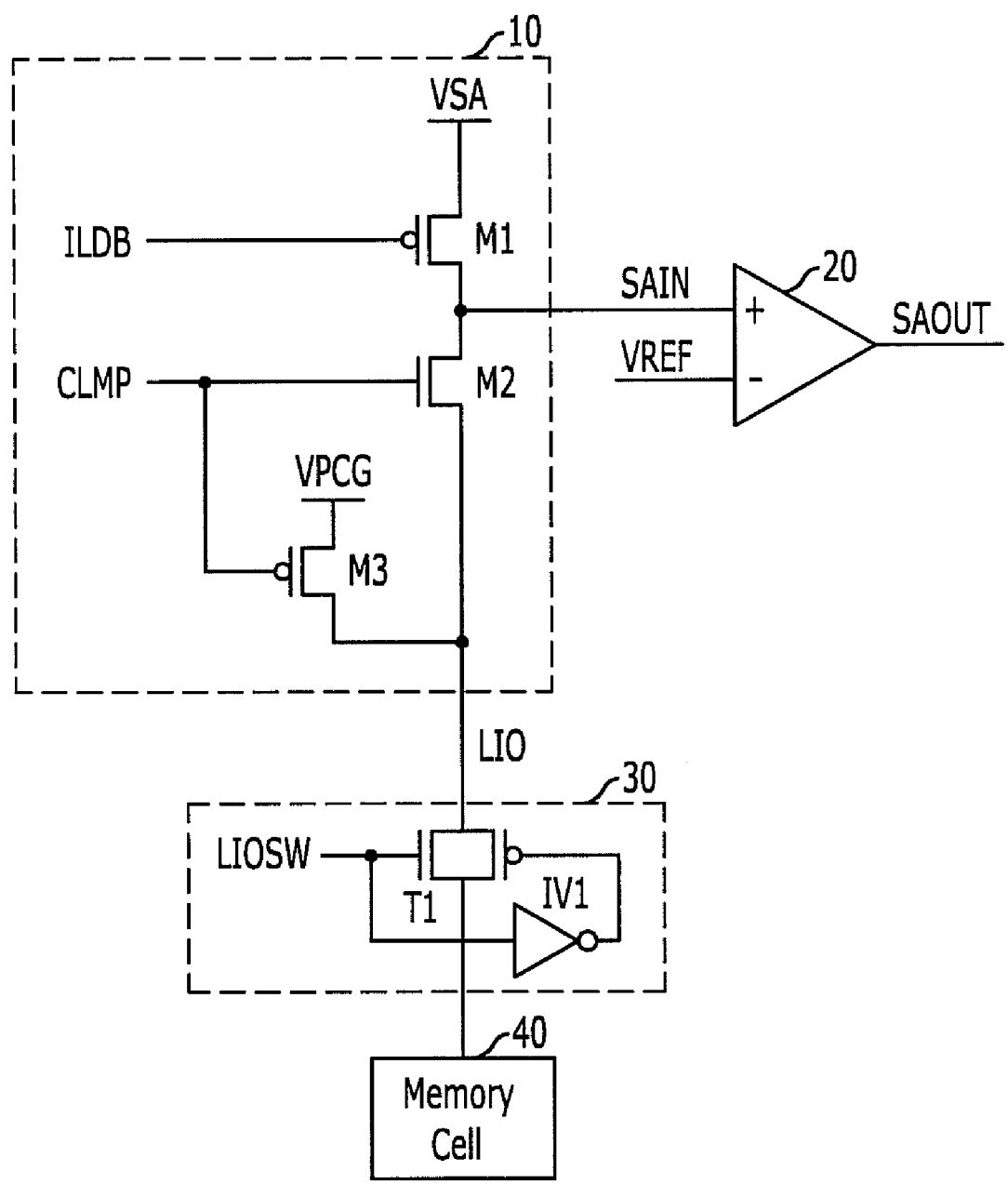
FIG. 1 is a circuit diagram illustrating a conventional memory device for performing a data read operation.
Figure 2:
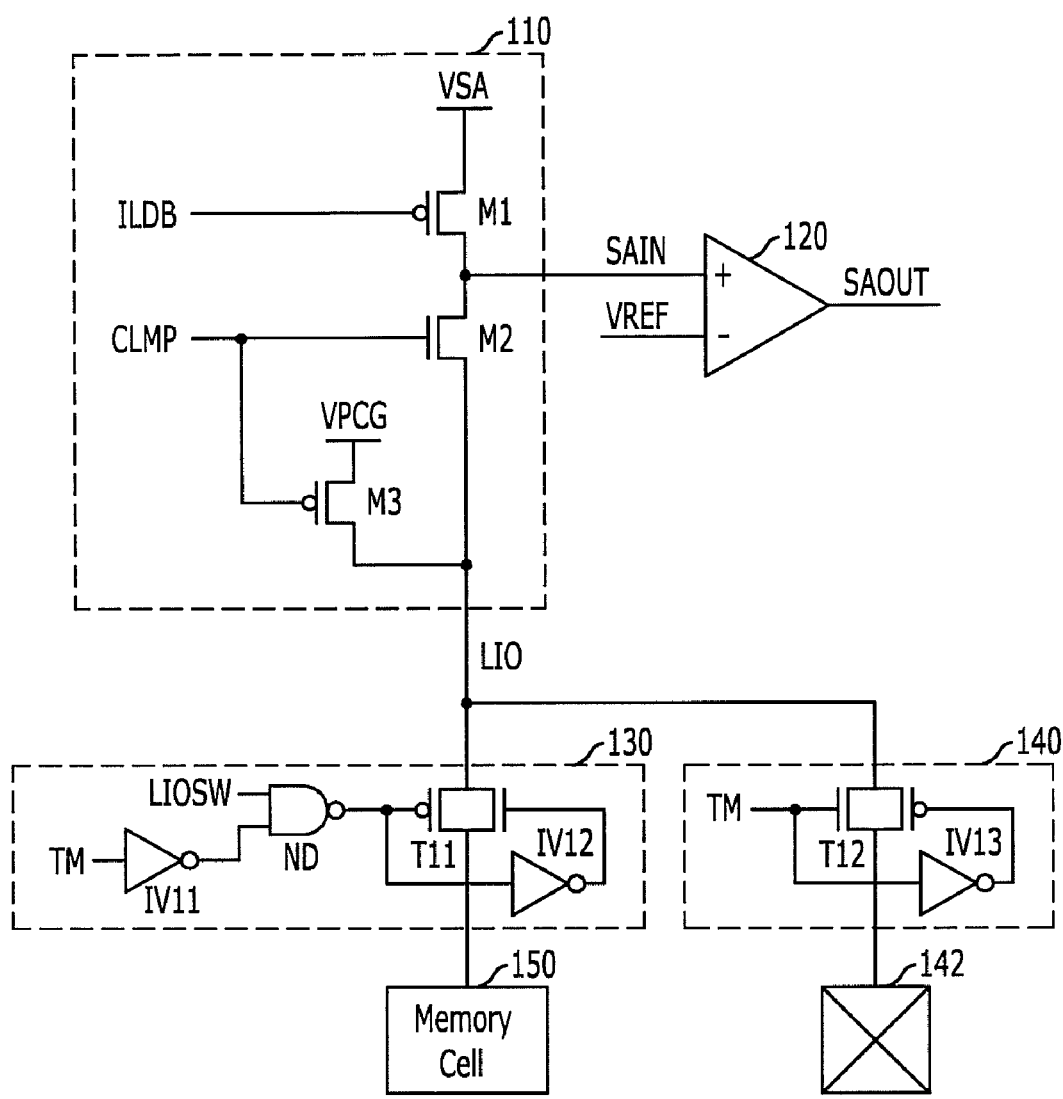
FIG. 2 is a circuit diagram illustrating a sensing characteristic evaluating apparatus for a semiconductor device using a memory cell in accordance with an embodiment of the present invention.

FIG. 2 is a circuit diagram illustrating a sensing characteristic evaluating apparatus for a semiconductor device using a memory cell in accordance with an embodiment of the present invention.

As shown in FIG. 2, the semiconductor device for evaluating a current sensing characteristic of a memory cell in accordance with an embodiment of the present invention includes a current-voltage converting unit 110, a sense amplifier 120 and a, a switching unit 130, a test current supply unit 140 and a memory cell 150.

The current-voltage converting unit 110 and the sense amplifier 120 are included a sense amplifying circuit for comparing and amplifying the sensing input voltage SAIN corresponding to a test current of the local input/output line LIO with a reference voltage VREF, and outputting an amplified sensing input voltage as a sensing output voltage SAOUT.

The current-voltage converting unit 110 is configured between a local input/output line LIO and the sense amplifier 120, and includes a first PMOS transistor M1, a first NMOS transistor M2 and a second PMOS transistor M3.

The first PMOS transistor M1 drives a current of the local input/output line LIO for producing the sensing input voltage SAIN in response to a current control signal ILDB. A drain of the first PMOS transistor M1 is commonly coupled to a drain of the first NMOS transistor M2. A sensing input voltage SAIN is outputted to the sense amplifier 120 through a common drain node of the first PMOS transistor M1 and the first NMOS transistor M2.

The first NMOS transistor M2 switches a connection between the local input/output line LIO and the first PMOS transistor M1. The second PMOS transistor M3 is coupled in parallel with the first NMOS transistor M2 through the local input/output line LIO, and performs a pre-charge operation of the local input/output line LIO by switching a pre-charge voltage VPCG to the local input/output line LIO. The current control signal ILDB is applied to a gate of the first PMOS transistor M1, and a clamp control signal CLMP is applied to gates of the first NMOS transistor M2 and the second PMOS transistor M3.

The switching unit 130 switches connection of the local input/output line LIO and the memory cell 150, and is controlled in response to a test mode signal TM and an input/output line switching signal LIOSW. The switching unit 130 connects the local input/output line LIO to the memory cell 150 during a normal mode for transferring data of the memory cell 150 to the local input/output line LIO.

The switching unit 130 includes a first inverter IV11, a NAND gate ND, a first transmission gate T11 and a second inverter IV12. The NAND gate ND performs a logical NAND operation on the input/output line switching signal LIOSW and the test mode signal TM inputted through the first inverter IV11. The first transmission gate T11 is configured between the local input/output line LIO and the memory cell 150 and has a parallel connection structure of a PMOS transistor and an NMOS transistor.

An output of the NAND gate ND is applied to a gate of the PMOS transistor of the first transmission gate T11 and the second inverter IV12. An output of the second inverter IV12 is applied to a gate of the NMOS transistor of the first transmission gate T11.

The test current supply unit 140 supplies a test current to the input/output line LIO during a test mode for evaluating a sensing characteristic in response to the test mode signal TM, and includes a third inverter IV13 and a second transmission gate T12 which are configured between the local input/output line LIO and an input pad 142.

The second transmission gate T12 has a parallel connection structure of a PMOS transistor and an NMOS transistor. The test mode signal TM is applied to the third inverter IV13 and a gate of the NMOS transistor of the second transmission gate T12. An output of the third inverter IV13 is applied to a gate of the PMOS transistor of the second transmission gate T12.

Hereinafter, an operation for evaluating a sensing characteristic will be described below in details.

The test mode signal TM maintains a logic low level during a normal mode, and a logic high level during a test mode. The clamp control signal CLMP maintains a logic low level and the current control signal ILDB maintains a logic high level before the test mode is performed or the data is read during the normal mode.

That is, before the test mode is performed or the data is read during the normal mode, the local input/output line LIO is charged by the pre-charge voltage VPCG because the first NMOS transistor M2 is turned off and the second PMOS transistor M3 is turned on.

In order to read the data during the normal mode, the input/output line switching signal LIOSW is shifted to a logic high level, the clamp control signal CLMP is shifted to the high logic level, and the current control signal ILDB is shifted to the low logic level. Accordingly, the first transmission gate T11 is turned on, the second PMOS transistor M3 is turned off, and the first PMOS transistor M1 and the first NMOS transistor N1 are turned on.

That is, a current path is formed from a sensing voltage VSA to the memory cell via the first PMOS transistor M1, first NMOS transistor M2, the local input/output line LIO and the switching unit 130. The current-voltage converting unit 110 outputs the current, which flows on the current path, for producing the sensing input voltage SAIN.

The sense amplifier 120 compares a predetermined reference voltage VREF with the sensing input voltage SAIN outputted from the current-voltage converting unit 110, and outputs the sensing output voltage SAOUT corresponding to a comparison result.

Meanwhile, in order to perform the test mode, because the test mode signal TM is shifted from a logic low level to a logic high level, the switching unit 130 is turned off and the test current supply unit 140 is turned on. The clamp control signal CLMP is shifted to the logic high level and the current control signal ILDB is shifted to the logic low level. Accordingly, the second transmission gate T12 is turned on, the second PMOS transistor M3 is turned off, and the first PMOS transistor M1 and the first NMOS transistor M2 are turned on.

That is, a current path is formed from a sensing voltage VSA to the input pad 142 via the first PMOS transistor M1, first NMOS transistor M2, the local input/output line LIO and the test current supply unit 140.

If a test voltage for a test is applied to the input pad 142, a test current is supplied between a sensing voltage VSA terminal and the input pad 142, and the current-voltage converting unit 110 outputs the test current, which flows on the current path, for producing the sensing input voltage SAIN.

The sense amplifier 120 compares a predetermined reference voltage VREF with the sensing input voltage SAIN outputted from the current-voltage converting unit 110, and outputs the sensing output voltage SAOUT corresponding to a comparison result.

As described above, a sense amplifier characteristic evaluation may be performed in accordance with an embodiment of the present invention.

Figure 3:
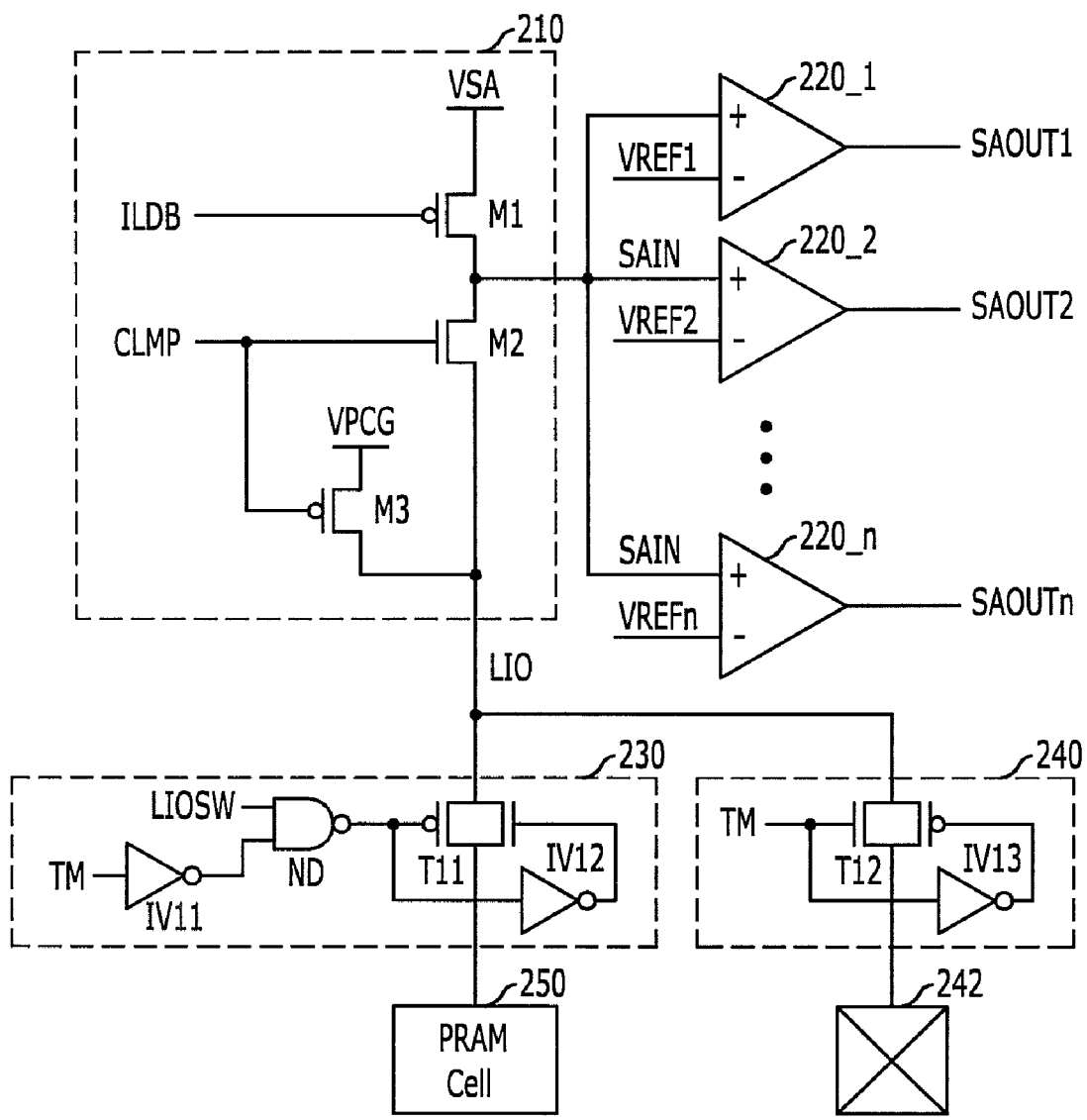
FIG. 3 is a circuit diagram illustrating a sensing characteristic evaluating apparatus for a semiconductor device using a PRAM cell in accordance with another embodiment of the present invention.

As shown in FIG. 3, another embodiment of a memory cell including multi-bit data is illustrated. FIG. 3 is a circuit diagram illustrating a sensing characteristic evaluating apparatus for a semiconductor device using a PRAM cell in accordance with another embodiment of the present invention.

The semiconductor device includes a current-voltage converting unit 210, a plurality of sense amplifiers 220_1, 220_2, . . . and 220_n, a switching unit 230, a test current supply unit 240 and a PRAM cell 250. Since the operation and structure of the current-voltage converting unit 210, the switching unit 230 and a test current supply unit 240 shown in FIG. 3 are same with the operation and structure of the same elements 110, 130 and 140 shown in FIG. 2, a detailed description thereof is omitted.

Because the PRAM cell 250 shown in FIG. 3 stores multi-bit data by differently setting a resistance characteristic during a write operation, the sense amplifiers 220_1, 220_2, . . . and 220_n are generally requested in order to sense the multi-bit data.

That is, different reference voltages VREF1, VREF2, . . . and VREFn corresponding to each bit of the multi-bit are set to each of the sense amplifiers 220_1, 220_2, . . . and 220_n. A test current provided from the input pad 242 to a local input/output line LIO is converted at the current-voltage converting unit 210, and a converted test current is provided as a sensing input voltage SAIN to each of the sense amplifiers 220_1, 220_2, . . . and 220_n.

Each of the sense amplifiers 220_1, 220_2, . . . and 220_n compares and amplifies the sensing input voltage SAIN with the reference voltages VREF1, VREF2, . . . and VREFn, and outputs amplified voltages as sensing output voltages SAOUT1, SAOUT2, . . . and SAOUTn.

That is, as shown in FIG. 3, characteristic evaluation of a sense amplifier of a semiconductor device for sensing multi-bit data may be performed in accordance with another embodiment of the present invention.

While the present invention has been described with respect to the specific embodiments, it will be apparent to those skilled in the art that various changes and modifications may be made without departing from the spirit and scope of the invention as defined in the following claims.

What is claimed is:

1. A sensing characteristic evaluating apparatus for a semiconductor device, comprising:
a test current supply unit configured to supply a test current to an input/output line during a test mode for evaluating a sensing characteristic; and
a sensing amplifying circuit configured to receive the test current from the input/output line, to compare and amplify a sensing input voltage corresponding to the test current with a reference voltage, and to output an amplified voltage as a sensing output voltage,
wherein the sensing amplifying circuit includes:
a current-voltage converting unit configured to pre-charge the input/output line before the test mode, and to drive the test current of the input/output line for producing the sensing input voltage during the test mode; and
a sense amplifier configured to compare and amplify the sensing input voltage with the reference voltage, and to output the amplified voltage as the sensing output voltage.

2. The sensing characteristic evaluating apparatus for the semiconductor device of claim 1, wherein the test current supply unit is configured to use a current, which is inputted through an input pad, as the test current.

3. The sensing characteristic evaluating apparatus for the semiconductor device of claim 1, wherein the test current supply unit is configured to use a current, which is generated by controlling a voltage level of an external voltage, as the test current.

4. The sensing characteristic evaluating apparatus for the semiconductor device of claim 1, wherein the test current supply unit includes a switching unit which is switched in response to a test mode signal which is activated corresponding to the test mode.

5. The sensing characteristic evaluating apparatus for the semiconductor device of claim 1 wherein the current-voltage converting unit includes:
a pre-charge unit configured to supply a pre-charge voltage to the input/output line before the test mode; and
a driving unit configured to drive the test current, which is inputted to the input/output line, for producing the sensing input voltage during the test mode.

6. The sensing characteristic evaluating apparatus for the semiconductor device of claim 5, wherein the pre-charge unit includes:
a first switching unit configured to electrically disconnect the input/output line from the driving unit before the test mode, and to electrically connect the input/output line to the driving unit during the test mode; and
a second switching unit configured to electrically connect the input/output line to the driving unit and to supply the pre-charge voltage to the input/output line before the test mode, and to electrically disconnect the input/output line from the driving unit during the test mode.

7. The sensing characteristic evaluating apparatus for the semiconductor device of claim 6, wherein the first switching unit and the second switching unit are configured to be operated in response to an identical control signal.

8. The sensing characteristic evaluating apparatus for the semiconductor device of claim 7, wherein the first switching unit is configured to include a PMOS transistor and the second switching unit is configured to include an NMOS transistor.

9. The sensing characteristic evaluating apparatus for the semiconductor device of claim 5, wherein the driving unit is configured to include a PMOS transistor which outputs the current of the input/output line in response to a current control signal.

10. The sensing characteristic evaluating apparatus for the semiconductor device of claim 1, wherein the input/output line is configured to include a local input/output line coupled to a memory cell.

11. A sensing characteristic evaluating apparatus for a semiconductor device, comprising:
a memory cell configured to store data;
a switching unit configured to electrically connect the memory cell to an input/output line in response to a test mode control signal and an input/output line switching signal during a normal mode for reading the data stored in the memory cell;
a test current supply unit configured to supply a test current to the input/output line in response to the test mode control signal during a test mode for evaluating a sensing characteristic;
a current-voltage converting unit configured to convert and output a current, which is provided from the switching unit and the test current supply unit via the input/output line, to a sensing input voltage; and
a sensing amplifying circuit configured to compare and amplify the sensing input voltage outputted from the current-voltage converting unit with a reference voltage, and to output an amplified voltage as a sensing output voltage.

12. The sensing characteristic evaluating apparatus for the semiconductor device of claim 11, wherein the switching unit includes:
- a logic gate configured to perform a logical NAND operation on the test mode signal and the input/output line switching signal; and
- a switch configured to be switched in response to an output of the logic gate.

13. The sensing characteristic evaluating apparatus for the semiconductor device of claim 12, wherein the switch is configured to be turned off in response to an enable state of the test mode signal.

14. The sensing characteristic evaluating apparatus for the semiconductor device of claim 11, wherein the test current supply unit is configured to use the current, which is inputted through an input pad, as the test current.

15. The sensing characteristic evaluating apparatus for the semiconductor device of claim 11, wherein the test current supply unit is configured to use a current, which is generated by controlling a voltage level of an external voltage, as the test current.

16. The sensing characteristic evaluating apparatus for the semiconductor device of claim 11, wherein the test current supply unit is configured to include a switch which is switched in response to a test mode signal activated during a test mode.

17. The sensing characteristic evaluating apparatus for the semiconductor device of claim 11, the current-voltage converting unit is configured to pre-charge the input/output line before the test mode, and to drive the test current of the input/output line for producing the sensing input voltage during the test mode.

18. The sensing characteristic evaluating apparatus for the semiconductor device of claim 17, wherein the current-voltage converting unit includes:
- a pre-charge unit configured to supply a pre-charge voltage to the input/output line before the test mode; and
- a driving unit configured to convert the test current, which is inputted through the input/output line, for producing the sensing input voltage during the test mode.

19. The sensing characteristic evaluating apparatus for the semiconductor device of claim 18, wherein the pre-charge unit includes:
- a first switching unit configured to electrically disconnect the input/output line from the driving unit before the test mode, and to electrically connect the input/output line to the driving unit during the test mode; and
- a second switching unit configured to electrically connect the input/output line to the driving unit and to supply the pre-charge voltage to the input/output line before the test mode, and to electrically disconnect the input/output line from the driving unit during the test mode.

20. The sensing characteristic evaluating apparatus for the semiconductor device of claim 19, wherein the first switching unit and the second switching unit are configured to be operated in response to an identical control signal.

21. The sensing characteristic evaluating apparatus for the semiconductor device of claim 20, wherein the first switching unit is configured to include a PMOS transistor and the second switching unit is configured to include an NMOS transistor.

22. The sensing characteristic evaluating apparatus for the semiconductor device of claim 18, wherein the driving unit is configured to include a PMOS transistor which outputs the current of the input/output line in response to a current control signal.

23. A sensing characteristic evaluating apparatus for a semiconductor device, comprising:
- a test current supply unit configured to supply a test current to an input/output line during a test mode for evaluating a sensing characteristic for N-bit data, N being an integer greater than one; and
- a sense amplifying circuit configured to include M sense amplifying units, to receive the test current of the input/output line, to compare and amplify a sensing input voltage corresponding to the test current with a reference voltage which is differently set to each of M sense amplifying units, and to output amplified voltages as sensing output voltages, M being an integer smaller than N.

24. The sensing characteristic evaluating apparatus for the semiconductor device of claim 23, wherein the test current supply unit is configured to use a current, which is inputted through an input pad, as the test current.

25. The sensing characteristic evaluating apparatus for the semiconductor device of claim 23, wherein the test current supply unit is configured to use a current, which is generated by controlling a voltage level of an external voltage, as the test current.

26. The sensing characteristic evaluating apparatus for the semiconductor device of claim 23, wherein the test current supply unit is configured to include a switching unit which is switched in response to a test mode signal activated during a test mode.

27. The sensing characteristic evaluating apparatus for the semiconductor device of claim 23, wherein the sensing amplifying circuit includes:
- a current-voltage converting unit configured to pre-charge the input/output line before the test mode, and to drive the test current of the input/output line for producing the sensing input voltage during the test mode; and
- a sense amplifier configured to compare and amplify the sensing input voltage with the reference voltage, and to output the amplified voltage as the sensing output voltage.

28. The sensing characteristic evaluating apparatus for the semiconductor device of claim 27, wherein the current-voltage converting unit includes:
- a pre-charge unit configured to supply a pre-charge voltage to the input/output line before the test mode; and
- a driving unit configured to drive the test current, which is inputted to the input/output line, for producing the sensing input voltage during the test mode.

29. The sensing characteristic evaluating apparatus for the semiconductor device of claim 28, wherein the pre-charge unit includes:
- a first switching unit configured to electrically disconnect the input/output line from the driving unit before the test mode, and to electrically connect the input/output line to the driving unit during the test mode; and
- a second switching unit configured to electrically connect the input/output line to the driving unit and to supply the pre-charge voltage to the input/output line before the test mode, and to electrically disconnect the input/output line from the driving unit during the test mode.

30. The sensing characteristic evaluating apparatus for the semiconductor device of claim 29, wherein the first switching unit and the second switching unit are configured to be operated in response to an identical control signal.

31. The sensing characteristic evaluating apparatus for the semiconductor device of claim 30, wherein the first switching unit is configured to include a PMOS transistor and the second switching unit is configured to include an NMOS transistor.

32. The sensing characteristic evaluating apparatus for the semiconductor device of claim 28, wherein the driving unit is configured to include a PMOS transistor which outputs the current of the input/output line in response to a current control signal.

33. The sensing characteristic evaluating apparatus for the semiconductor device of claim 23, wherein the input/output line includes a local input/output line coupled to a memory cell.

34. The sensing characteristic evaluating apparatus for the semiconductor device of claim 23, wherein N is four.

35. The sensing characteristic evaluating apparatus for the semiconductor device of claim 34, wherein M is three.

36. A sensing characteristic evaluating apparatus for a semiconductor device, comprising:
- a phase random access memory (PRAM) cell configured to store N-bit data, N being an integer greater than one;
- a switching unit configured to electrically connect the PRAM cell to an input/output line in response to a test mode control signal and an input/output line switching signal during a normal mode for reading the data stored in the PRAM cell;
- a test current supply unit configured to supply a test current to the input/output line in response to the test mode control signal during a test mode for evaluating a sensing characteristic;
- a current-voltage converting unit configured to convert and output a current, which is provided from the switching unit and the test current supply unit via the input/output line, to a sensing input voltage; and
- a sensing amplifying circuit configured to include M sense amplifying units, to compare and amplify the sensing input voltage outputted from the current-voltage converting unit with reference voltages, and to output amplified voltages as sensing output voltages,
- wherein the reference voltages are differently set to each of M sense amplifying units.

37. The sensing characteristic evaluating apparatus for the semiconductor device of claim 36, wherein the switching unit includes:
- a logic gate configured to perform a logical NAND operation on the test mode signal and the input/output line switching signal; and
- a switch configured to be switched in response to an output of the logic gate.

38. The sensing characteristic evaluating apparatus for the semiconductor device of claim 37, wherein the switch is configured to be turned off in response to an enable state of the test mode signal.

39. The sensing characteristic evaluating apparatus for the semiconductor device of claim 36, wherein the test current supply unit is configured to use the current, which is inputted through an input pad, as the test current.

40. The sensing characteristic evaluating apparatus for the semiconductor device of claim 36, wherein the test current supply unit is configured to use a current, which is generated by controlling a voltage level of an external voltage, as the test current.

41. The sensing characteristic evaluating apparatus for the semiconductor device of claim 36, wherein the test current supply unit is configured to include a switch which is switched in response to a test mode signal activated during a test mode.

42. The sensing characteristic evaluating apparatus for the semiconductor device of claim 36, the current-voltage converting unit is configured to pre-charge the input/output line before the test mode, and to drive the test current of the input/output line for producing the sensing input voltage during the test mode.

43. The sensing characteristic evaluating apparatus for the semiconductor device of claim 42, wherein the current-voltage converting unit includes:
- a pre-charge unit configured to supply a pre-charge voltage to the input/output line before the test mode; and
- a driving unit configured to convert the test current, which is inputted through the input/output line, for producing the sensing input voltage during the test mode.

44. The sensing characteristic evaluating apparatus for the semiconductor device of claim 43, wherein the pre-charge unit includes:
- a first switching unit configured to electrically disconnect the input/output line from the driving unit before the test mode, and to electrically connect the input/output line to the driving unit during the test mode; and
- a second switching unit configured to electrically connect the input/output line to the driving unit and to supply the pre-charge voltage to the input/output line before the test mode, and to electrically disconnect the input/output line from the driving unit during the test mode.

45. The sensing characteristic evaluating apparatus for the semiconductor device of claim 44, wherein the first switching unit and the second switching unit are configured to be operated in response to an identical control signal.

46. The sensing characteristic evaluating apparatus for the semiconductor device of claim 45, wherein the first switching unit is configured to include a PMOS transistor and the second switching unit is configured to include an NMOS transistor.

47. The sensing characteristic evaluating apparatus for the semiconductor device of claim 43, wherein the driving unit is configured to include a PMOS transistor which outputs the current of the input/output line in response to a current control signal.

\* \* \* \* \*